United States Patent [19]

Nelson et al.

[11] 4,273,609
[45] Jun. 16, 1981

[54] RINSE MELT FOR LPE CRYSTALS

[75] Inventors: Gary L. Nelson, Eagan; William A. Harvey, Minneapolis, both of Minn.

[73] Assignee: Sperry Corporation, New York, N.Y.

[21] Appl. No.: 954,511

[22] Filed: Oct. 25, 1978

[51] Int. Cl.³ .............................................. C30B 19/02
[52] U.S. Cl. ............................ 156/624; 156/DIG. 63
[58] Field of Search ....... 156/624, 621, 622, DIG. 63, 156/DIG. 111; 134/42; 148/1.5, 171

[56] References Cited

U.S. PATENT DOCUMENTS

| 3,050,407 | 8/1962 | Nielsen | 156/624 |
| 3,079,240 | 2/1963 | Remeika | 156/624 |
| 3,447,976 | 6/1969 | Faust, Jr. et al. | 156/624 |
| 3,486,937 | 12/1969 | Linares | 156/624 |

OTHER PUBLICATIONS

IEEE Transactions, vol. Mag.-9, No. 3, Sep. 1973, pp. 366-372, Hewitt et al.
Journal of Crystal Growth 18 (1973) pp. 294-296, Robertson.

Primary Examiner—Hiram Bernstein
Attorney, Agent, or Firm—Douglas L. Tschida; Kenneth T. Grace; William E. Cleaver

[57] ABSTRACT

A rinse process for solvating adhered primary melt residue from magnetic garnet crystals grown via liquid phase epitaxial (LPE) techniques. The rinse melt consists of a mixture having a saturation to nucleation temperature range that encompasses the primary melt's growth temperature and a solvent compound different from that used in the primary melt, which will solvate the solvent used in the primary melt and will not produce undesirable rinse melt adhesion.

10 Claims, 3 Drawing Figures

RINSE MELT FOR LPE CRYSTALS

BACKGROUND OF THE INVENTION

The present invention relates to magnetic-optic light deflectors and more specifically to the growing of magnetic garnet crystals by liquid phase epitaxy (LPE) on another garnet substrates. The growth of the (LPE) crystals is achieved by preparing a super-saturated primary melt containing a bismuth compound solvent; immersing a prepared substrate in the primary melt for a predetermined growth period; and then removing the epitaxially grown crystal-substrate combination from the melt. Upon removal of the LPE crystal-substrate combination, it is necessary to remove the residue of the primary melt that clings to the LPE crystal. This residue removal previously has been done by spinning the crystal, but the wetting characteristics and viscosities of primary melts containing bismuth limit the efficiency of this technique.

The residue that clings to the LPE crystal consists essentially of the primary melt's solvent compounds, (i.e., $Bi_2O_3$, $PbO$, $Na_2O$, $V_2O_5$ or $B_2O_3$) which upon cooling causes crystals of non-uniform magneto-optic properties, non-uniform thicknesses, cracking or fracturing of the crystal or otherwise results in defective and unusable crystals.

SUMMARY OF THE INVENTION

The present invention teaches a rinse process and several rinse melt compositions for removing the residual primary melt adhering to magnetic garnet crystals grown via LPE on supporting garnet substrates. The rinse process consists essentially of the growth of an LPE magnetic garnet crystal on a supporting substrate with the subsequent immersion of the epitaxially grown crystal in the rinse melt to solvate any residual primary melt adhering to the crystal-substrate combination. The rinse process is performed at a temperature within the range of temperatures containing the primary melt's growth temperature and the range is defined by the overlap of the primary melt's saturation to nucleation temperature range and the rinse melt's saturation to nucleation temperature range.

The rinse melt mixture is characterized by the following properties: the saturation to nucleation temperature range is adjusted to encompass the primary melt's growth temperature; the mixture contains a super-saturated mixture, with respect to the primary melt's solute, of a solvent compound different from that used in the primary melt, which will solvate the adhered primary melt solvent.

DESCRIPTION OF THE PREFERRED EMBODIMENT

Figures 1, 3:
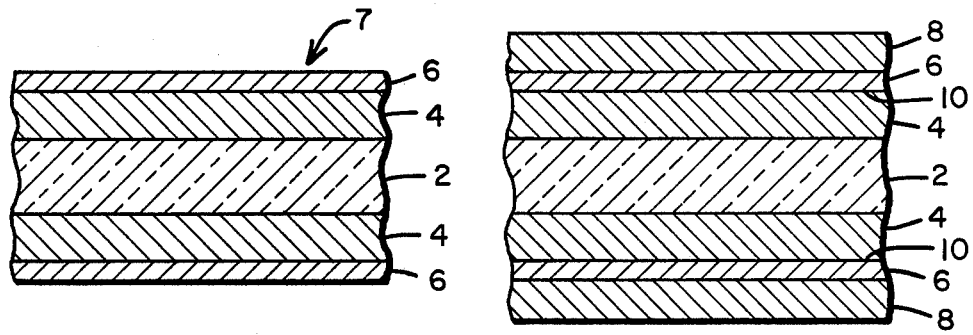
FIG. 1 shows a symmetrical structure of a magnetic garnet crystal grown via liquid phase epitaxy on a supporting substrate with a decoupling layer grown from the rinse melt over the combination.
FIG. 3 shows a multilayer structuure of one magnetic garnet crystal layer grown over another magnetic garnet crystal with an intervening decoupling layer.

In U.S. patent application Ser. No. 817,754 of T. R. Johansen, et al, a number of primary melt compositions for growing bismuth substituted magnetic garnet crystals by liquid phase epitaxy on Gadolinium Gallium Garnet (GGG) substrates are disclosed. The epitaxial crystals grown with the disclosed compositions provide for maximum bismuth substitutions within the LPE magnetic garnet crystal lattice, which is desirable in order to maximize the crystal's magneto-optic efficiency by maximizing its coefficient of Faraday rotation (F).

Experiments with these and various other bismuth substituted primary melt compositions have been hampered however by the inability to remove the residual primary melt which adheres to the LPE crystal-substrate combination upon removal from the primary melt. In previous work with growing LPE crystals, not containing bismuth, the residual coating has been removed by pulling the crystal from the melt and mechanically spinning the crystal, while it is still at a temperature closely approximating the growth temperature, such that the centrifugal force overcomes the mechanical and chemical forces promoting the adhesion of the residue. The wetting characteristics and viscosities of the melts containing bismuth, however, are such that spinning does not remove the residue. Acid etching after the cooling of the LPE crystal has been attempted, but this too has shown limited effectiveness in that the damage has already occurred.

While the adhesion problem has been experienced with all the primary melt compositions containing $Bi_2O_3$ that have been attempted, the problem has proved most difficult in primary melts using bismuth-vanadium solvents where LPE crystals having potentially superior magneto-optic properties were grown but due to the inability to remove the residual primary melt the LPE crystals upon cooling were mechanically defective or otherwise unusable and measurement of the LPE crystal's magneto-optic properties couldn't be made.

The present invention provides a means for overcoming the adhered residual primary melt problem and at the same time permits the growth of a non-absorbtive decoupling layer over the LPE crystal-substrate combination. The decoupling layer, if grown for a single layer structure, acts in much the same manner as a passivation layer in that it serves to protect the LPE crystal-substrate combination from damage to the LPE crystal's lattice structure and magnetic properties. The decoupling layer, if grown for a multilayer structure, is generally comprised of a non-magnetic material and serves to decouple adjacent magnetic garnet layers from exchange interaction and to protect the underlying LPE crystal during the subsequent processing steps.

To overcome the adhered residual melt problem the present invention requires the preparation of a rinse melt that will solvate the adhered primary melt and not have any undesirable adhesion properties of its own. Additional desirable properties of such a rinse melt composition are that the rinse melt solvent be a different compound than that used as the solvent in the primary melt to promote solution of the adhered primary melt solvent, while simultaneously being saturated or supersaturated with respect to the primary melt's solute compound; and that the rinse melt saturation to nucleation temperature range encompass the primary melt's growth temperature.

Referring to FIG. 1 and after the preparation of a rinse melt mixture having the above properties, the LPE crystals are grown in the following manner and sequence of steps: (1) the rinse melt and primary melt mixtures are simultaneously heated in separate platinum crucibles in an appropriate furnace and in a clean environment to a temperature on the order of 200° C. above the primary melt's growth temperature; (2) the melts are cooled to the primary melt growth temperature; (3) the substrate 2 after having been preheated to a temperature on the order of the primary melt growth temperature is immersed in the primary melt; (4) the substrate 2 is rotated during the growth period until an epitaxial crystal 4 of the desired thickness is grown; (5) the thus grown epitaxial crystal-substrate combination 7 is withdrawn from the primary melt and the combination 7, while still at a temperature very closely approximating the growth temperature, is spun to remove as much of the primary melt residue as possible; (6) the epitaxial crystal-substrate combination 7 is next inserted into the rinse melt, which is at its saturation temperature or into its super-saturation temperature range but above its nucleation temperature, for a period sufficient to solvate the primary melt residue still adhering to the LPE crystal-substrate combination 7, (If the rinse melt temperature is held at its saturation point no additional growth action will occur but if it is into its super-saturation temperature range a decoupling layer 6 will grow over the epitaxial crystal-substrate combination 7.); the combination 7 structure with or without a decoupling layer 6 is finally withdrawn from the furnace in an appropriate manner to prevent thermal shock to the combination 7. It is to be observed that the rinse process must occur as close as possible to the primary melt's growth temperature, especially where the primary melt contains bismuth, and as soon as possible after the step 5 withdrawal to stop the growth action of the adhered primary melt residue which continues even after withdrawal.

Depending on the specific LPE crystal's 4 application further processing of the LPE crystal 4 can be performed by growing additional epitaxial crystal layers over the LPE crystal 4 or the decoupling layer 6 or mechanically or chemically preparing the geometries of the LPE crystal 4 such as mechanically removing or etching the crystal 4 and decoupling layer from one surface of the substrate 2, cutting the thus prepared combination to a specific shape or further shaping the LPE crystal 4 to obtain crystals free from undesirable defects.

The present invention differs from the LPE etch technique described in an article by J. M. Robertson, et al, appearing in the Journal of Crystal Growth 18 (1973) pp. 294–296, entitled Garnet Substrate Preparation By Homoepitaxy, in that the above article describes the use of a melt composition corresponding to the composition of a non-magnetic supporting garnet substrate as an etchant for preparing the substrate's surface with the subsequent homoepitaxial growth on the etched substrate. The article doesn't anticipate the use of such a composition for solvating primary melt residue adhering to LPE crystals grown in subsequent process steps in that the etching process described requires the etching to occur at a temperature above the melt's saturation temperature with the subsequent lowering of the melt temperature into its super-saturation range to grow the homoepitaxial layer on the substrate to replace the etched portion and thereby achieve the relatively defect free surface on which to grow the LPE crystal layers. Such a melt mixture, however, may be used in conjunction with the teachings of the present invention (i.e., in the range between its saturation and nucleation temperature) to either solvate the primary melt residue or solvate and grow a decoupling layer 6.

Specific rinse melt mixtures which have been applied in the manner described herein for a bismuth-vanadium primary melt having a growth temperature of 950° C. are as follows:

TABLE 1

| Compound | Mol. % for (111) GGG Melt | Mol. % for (111) SmGG Melt |
|---|---|---|
| Solvent: | | |
| PbO | 87.50 | 85.68 |
| $B_2O_3$ | 7.50 | 7.34 |
| Solute: | | |
| $Ga_2O_3$ | 3.33 | 3.95 |
| $Gd_2O_3$ | 1.67 | — |
| $Sm_2O_3$ | — | 3.03 |

It is to be recognized however that the solute to solvent ratio, the solvent to solvent or the solute to solute ratio used in the rinse melt may be adjusted to shift the rinse melt's saturation to nucleation temperature range to match the growth temperature of the primary melt, to track precipitation phase changes with saturation temperature change and to compensate for the specific crystal orientation of the substrate. Such quantitative adjustments typically are made experimentally by first adjusting the solute to solvent concentration to achieve temperature orientation and then adjusting the solute to solute ratio as necessary to achieve phase orientation.

Figure 2:
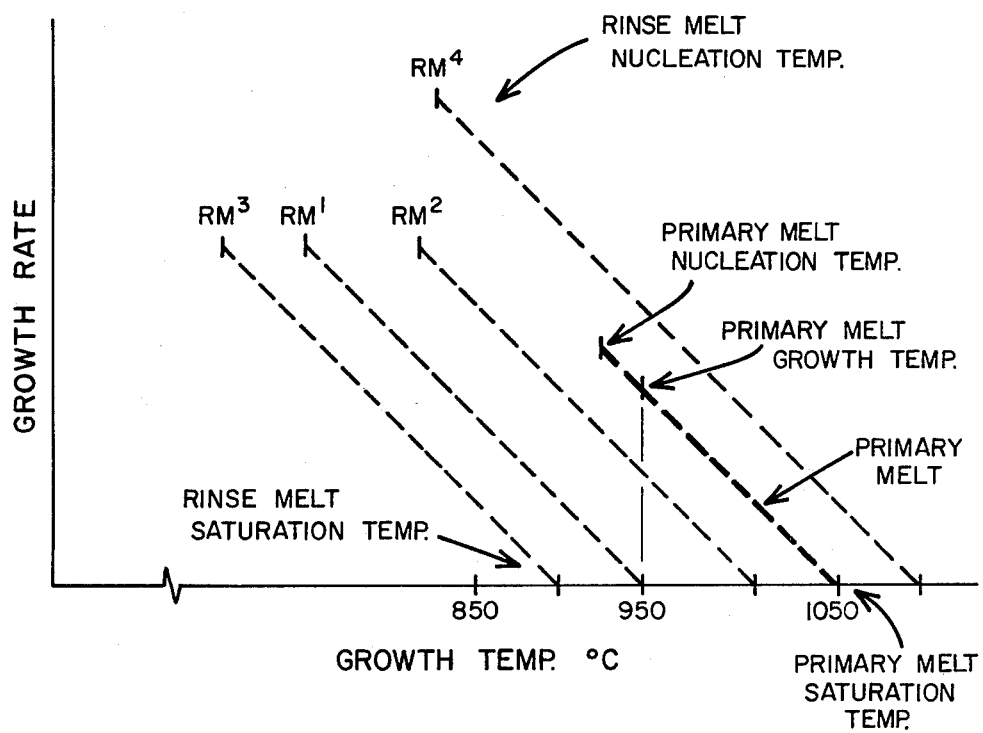
FIG. 2 is a graphical representation of the relative relationships between several rinse melt growth temperature curves and a bismuth-vanadium primary melt growth temperature curve.

Referring to FIGS. 1 and 2, the structure and the relative relationships of several representative rinse melt mixture growth curves of the type described herein to a bismuth-vanadium substituted primary melt are shown. It is to be understood, however, that the specific shape and slopes of the growth curves are not shown to scale in that it is only the relative temperature relationships between the primary melt mixture's saturation to nucleation temperature range and the rinse melt mixtures' saturation to nucleation temperature range that are of significance. Recognizing that the primary melt growth temperature, approximately 950° C. is fixed at a temperature where the LPE bismuth substituted magnetic garnet to substrate lattice mismatch is minimized to relieve lattice strain in the manner described the pending application of T. R. Johansen, et al, Ser. No. 817,754, the rinse melt can be adjusted to produce a rinse melt growth curve having its saturation to nucleation temperature range encompass the primary melt's growth temperature. Where a rinse melt composition $RM^1$ is used, its saturation temperature matches the primary melt growth temperature, the primary melt residue will be solvated during the rinse period and no additional growth will occur; for the $RM^2$ melt composition, solvation occurs and a decoupling layer 6 would grow and the thickness of the layer 6 would be dependent on the length of the rinse period. To use a rinse melt having a saturation temperature below the primary growth temperature as in $RM^3$, however, would result in the undesirable etching of the LPE crystal 4 in the manner as described in the Robertson article. RM[4] represents the case where the rinse melt temperature range encompasses the primary melt temperature range and has a faster growth rate. The rinse melt solute, solvent and solute to solvent mixture ratios and the rinse period must therefore be adjusted to constrain the rinse melt saturation to nucleation temperature range to encompass the primary melt growth temperature and to provide for the desired amount of decoupling layer 6 growth.

The decoupling layer 6, which grows on the LPE crystal 4 when rinsing in the super-saturation region above the nucleation temperature of the rinse melt, while protecting the LPE crystal 4 from damage due to handling, etc., has also been discovered to protect the LPE crystal 4 from many of the deleterious effects which can result during any subsequent process steps, especially where another magnetic crystal is grown directly over the LPE crystal 4 in the next succeeding process steps.

Referring to FIG. 3 a multilayer structure is shown, and it has been observed from past work that when an LPE magnetic garnet crystal 8 not containing bismuth is grown directly over an LPE magnetic garnet crystal 4 containing bismuth, the LPE crystal 4 containing bismuth is attacked in the interface region 10 such that the resulting multilayer structures are unusable. It is speculated that the LPE crystal 8 melt solvates the bismuth from the LPE crystal 4 but the exact reaction is not understood. Where, however, the crystal 8 not containing bismuth is grown over a decoupling layer 6 no deleterious mechanical, chemical or electrical effects are observed to the LPE crystal 4 containing bismuth or the LPE crystal 8 not containing bismuth.

While destructive interaction has occurred in some instances, it should further be recognized that there are LPE magnetic garnet crystal melts which can be grown directly over the bismuth containing magnetic garnet crystal 6 and the subsequent magnetic garnet crystal 8 melt can also be used as the rinse melt. A melt mixture which could be expected to meet these requirements is a YIG-PbO melt such as disclosed in Table II. Such a melt possesses the attributes described herein and permits the minimization of process steps.

TABLE II

| Compound | Mol. % for (111) GGG Melt |
|---|---|
| Solvent: | |
| PbO | 78.73 |
| $B_2O_3$ | 12.28 |
| Solute: | |
| $Y_2O_3$ | 8.35 |
| $Fe_2O_3$ | .64 |

What is claimed is:

1. In a liquid phase epitaxial process for growing a magnetic garnet crystal on a supporting garnet substrate from a garnet phase, primary melt, comprised of a solute and a solvent, at a growth temperature within the saturation to nucleation temperature range of said garnet phase, primary melt, an improvement therein for solvating adhered primary melt residue from the epitaxially grown magnetic garnet crystal comprising:
preparing a garnet phase, rinse melt mixture having a solvent different from that used in said primary melt and a saturation to nucleation temperature range which includes said growth temperature;
heating said garnet phase, rinse melt mixture to a temperature within the common range of the saturation to nucleation temperature ranges of said respective primary melt and said rinse melt mixture, thereby producing a rinse melt; and
immersing said epitaxially grown magnetic garnet crystal, upon withdrawal from said primary melt and while said magnetic garnet crystal is approximately at said growth temperature, in said rinse melt until said adhered primary melt residue is solvated from said epitaxially grown magnetic garnet crystal.

2. A process as set forth in claim 1 wherein said rinse melt mixture's saturation temperatuure is greater than said growth temperature and said rinse melt is heated to said growth temperature and the duration said epitaxially grown magnetic garnet crystal is immersed in said rinse melt is extended beyond the period necessary to solvate said primary melt residue, thereby epitaxially growing a garnet decoupling layer from said rinse melt over said magnetic garnet crystal.

3. A process as set forth in claim 1 wherein said rinse melt mixture's saturation temperature is equal to said growth temperature and said rinse melt mixture is heated to said growth temperature, thereby solvating only said adhered primary melt residue during said immersion without growing a decoupling layer.

4. A process as set forth in claim 1 wherein said solvent of said primary melt contains a bismuth compound for growing a bismuth substituted magnetic garnet crystal.

5. In a liquid phase epitaxial process for growing a bismuth substituted magnetic garnet crystal on a supporting garnet substrate from a garnet phase, primary melt comprised of a solute and a solvent at a growth temperature within the saturation to nucleation temperature range of said garnet phase, primary melt, an improvement therein for solvating adhered primary melt residue from the epitaxially grown bismuth substituted magnetic garnet crystal comprising:
preparing a rinse melt mixture having a garnet phase precipitate identical to said supporting garnet substrate at said growth temperature and a solvent compound different from that used in said primary melt and a saturation to nucleation temperature range which encompasses said growth temperature;
heating said rinse melt mixture to said growth temperature, thereby producing a rinse melt; and
immersing said epitaxially grown bismuth substituted magnetic garnet crystal, upon withdrawal from said primary melt and while said magnetic garnet crystal is approximately at said growth temperature, in said rinse melt until said adhered primary melt residue is solvated from said epitaxially grown bismuth substituted magnetic garnet crystal.

6. A process as set forth in claim 1 wherein said rinse melt mixture consists essentially of:
PbO: 78.73 Mol. %
$B_2O_3$: 12.28 Mol. %
$Y_2O_3$: 8.35 Mol. %
$Fe_2O_3$: 0.64 Mol. %.

7. A process as set forth in claim 4 or 5 wherein said supporting garnet substrate is a gadolinium gallium garnet ($Gd_3Ga_5O_{12}$).

8. A process as set forth in claim 7 wherein said rinse melt mixture consists essentially of:
$Gd_2O_3$: 1.67 Mol. %
$Ga_2O_3$: 3.33 Mol. %

PbO: 87.50 Mol. %

B$_2$O$_3$: 7.50 Mol. %.

9. A process as set forth in claim 4 or 5 wherein said supporting garnet substrate is a samarium gallium garnet (SM$_3$Ga$_5$O$_{12}$).

10. A process as set forth in claim 9 wherein said rinse melt mixture consists essentially of:

Sm$_2$O$_3$: 3.03 Mol. %

Ga$_2$O$_3$: 3.95 Mol. %

PbO: 85.68 Mol. %

B$_2$O$_3$: 7.34 Mol. %.

* * * * *